(12) United States Patent
Elsayed et al.

(10) Patent No.: US 10,868,505 B1
(45) Date of Patent: Dec. 15, 2020

(54) CMOS INPUT STAGE CIRCUITS AND RELATED METHODS

(71) Applicant: Silicon Laboratories Inc., Austin, TX (US)

(72) Inventors: Mohamed M. Elsayed, Austin, TX (US); Sudipta Sarkar, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 70 days.

(21) Appl. No.: 16/431,067

(22) Filed: Jun. 4, 2019

(51) Int. Cl.
*H03F 3/45* (2006.01)

(52) U.S. Cl.
CPC ..... *H03F 3/45708* (2013.01); *H03F 3/45112* (2013.01); *H03F 2203/45392* (2013.01)

(58) Field of Classification Search
CPC ..... H03F 3/45; H03F 3/45112; H03F 3/45708
USPC .................................................. 330/253, 258
See application file for complete search history.

(56) References Cited

U.S. PATENT DOCUMENTS

| | | | | |
|---|---|---|---|---|
| 4,555,673 | A | * | 11/1985 | Huijsing ............. H03F 3/45085 330/252 |
| 5,371,474 | A | * | 12/1994 | Wassenaar ............ H03F 3/4521 330/253 |
| 5,631,607 | A | | 5/1997 | Huijsing et al. |
| 5,714,906 | A | | 2/1998 | Motamed et al. |

OTHER PUBLICATIONS

Carrillo et al., "Constant-GM Constant-Slew-Rate High-Bandwidth Low-Voltage Rail-to-Rail CMOS Input Stage for VLSI Cell Libraries", IEEE Journal of Solid State Circuits, 9 pgs (Aug. 2003).
Redman-White, "A High Bandwidth Constant Gm and Slew-Rate Rail-to-Rail CMOS Amplifier Circuit for Embedded Low-Voltage Applications", Symposium on VLSI Circuits Digest of Technical Papers, 2 pgs. (1996).
Redman-White, A High Bandwidth Constant Gm and Slew-Rate Rail-to-Rail CMOS Input Circuit and Its Application to Analog Cells for Low Voltage VLSI Systems, IEEE, 12 pgs. (May 1997).

* cited by examiner

*Primary Examiner* — Steven J Mottola
(74) *Attorney, Agent, or Firm* — Egan Peterman Enders Huston

(57) ABSTRACT

Embodiments of improved CMOS input stage circuits and related methods are provided herein to maintain a near constant transconductance across an entire common-mode input voltage range of the input stage. One embodiment includes a pair of NMOS input transistors and a pair of PMOS input transistors, each coupled to receive a differential input voltages at their gate terminals; a current source coupled to source terminals of the pair of PMOS input transistors and configured to generate a current; a current steering circuit configured to steer the current to the pair of NMOS input transistors and/or to the pair of PMOS input transistors, depending on whether a common mode input voltage (CMV) is greater than, less than, or substantially equal to a cross-over voltage; and a current stealing circuit configured to reduce the current when the CMV is substantially equal to the cross-over voltage.

21 Claims, 6 Drawing Sheets

US 10,868,505 B1

CMOS INPUT STAGE CIRCUITS AND RELATED METHODS

BACKGROUND

1. Field of the Disclosure

This disclosure relates to operational amplifiers and, more particularly, to an input stage of an operational amplifier.

2. Description of the Relevant Art

The following descriptions and examples are provided as background only and are intended to reveal information that is believed to be of possible relevance to the present invention. No admission is necessarily intended, or should be construed, that any of the following information constitutes prior art impacting the patentable character of the subjected matter claimed herein.

Operational amplifiers are commonly used in electronic circuit design to amplify an input signal and provide an amplified output signal. An operational amplifier typically includes an input stage for the initial amplification and an output stage for providing drive capability and possibly further amplification. In some cases, the amplifier may further include intermediate stages for level shifting and conversion to single-ended operation.

The input stage of an operational amplifier provides the initial gain and usually defines the bandwidth of the amplifier. The input stage has at least one associated transconductance ($g_m$), or gain between the input voltage signal and the current supplied to either the intermediate stages or the final output stage of the amplifier. It is generally desirable for the input stage to have a constant transconductance to provide constant bandwidth and constant gain for the amplifier. If the transconductance of the input stage varies, the amplifier bandwidth will vary which has a direct impact on the amplifier stability.

The input stage of a low-voltage amplifier often has to deal with rail-to-rail common-mode input voltage. To obtain a rail-to-rail common-mode input voltage swing, the input stage may include two complementary pairs of input transistors placed in parallel. FIG. 1 (Prior Art) is a circuit diagram of a complementary metal-oxide-semiconductor (CMOS) input stage 100 including a PMOS input pair (P1, P2) and NMOS input pair (N1, N2). In the prior art embodiment shown in FIG. 1 (Prior Art), a current source is coupled to supply a tail current ($I_{tail}$) to each input pair (e.g., P1-P2 and N1-N2) of the CMOS input stage. The outputs of complementary input pairs are coupled to a pair of cascoded current summation circuits (e.g., N3-N6 and P3-P6), such that currents from the PMOS input pair (P1, P2) are summed by one current summation circuit (N3-N6), and currents from the NMOS input pair (N1, N2) are summed by another current summation circuit (P3-P6). Depending on the common-mode input voltage (average of $V_{IP}$ and $V_{IN}$) supplied to the gate terminals of the complementary input pairs, the currents from the PMOS input pair (P1, P2) and/or the currents from the NMOS input pair (N1, N2) are summed to produce an output voltage ($V_O$) for the input stage.

The common-mode input voltage (CMV) range of CMOS input stage 100 can be divided into three regions: (1) a low CMV region (e.g., $CMV<(2V_{Odn}+V_{THn})$) where only the PMOS input pair is "on", (2) an intermediate CMV region (e.g., $(2V_{Odn}+V_{THn})<CMV<(V_{DD}-V_{Odp}+|V_{THp}|)$) where both the PMOS and NMOS input pairs are "on", and (3) a high CMV region (e.g., $CMV>(V_{DD}-(2V_{Odp}+|V_{THp}|))$) where only the NMOS input pair is "on". The transconductance ($g_m$) of the input stage shown in FIG. 1 (Prior Art) is $g_{mp}$ in the low CMV region, $g_{mn}$ in the high CMV region, and $g_{mp}+g_{mn}$ in the intermediate CMV region. As such, when the common-mode input voltage moves from the low CMV or high CMV region to the intermediate CMV region, the transconductance ($g_m$) of the input stage changes by a factor of 2 assuming $g_{mn}=g_{mp}$. The inconsistent $g_m$ when transitioning from one region to another results in poor linearity over the common-mode input voltage range. Since the unity-gain bandwidth (UGB) and stability of the amplifier are also dependent on the $g_m$ of the input stage, it is generally desirable for the $g_m$ to be constant over the entire common-mode input voltage range (e.g., $0-V_{DD}$).

There are various ways to achieve near constant $g_m$ in the input stage while maintaining rail-to-rail operation. One such method, shown in FIG. 2 (Prior Art), uses a "current steering" circuit (e.g., P7, N7 and N8) to steer the tail current ($I_{tail}$) away from one of the complementary input pairs of the CMOS input stage when the common-mode input voltage is above or below a cross-over voltage ($V_{cross}$). The CMOS input stage 200 shown in FIG. 2 (Prior Art) is similar to that shown in FIG. 1 (Prior Art). In lieu of a current source supplying a tail current ($I_{tail}$) to the PMOS input pair (P1, P2), however, CMOS input stage 200 couples a PMOS transistor (P7) in parallel with the PMOS input pair (P1, P2), and couples an NMOS current mirror (N7 and N8) between the drain terminal of transistor P7 and the source terminals of the NMOS input pair (N1, N2).

The gate terminal of transistor P7 is coupled to receive a cross-over voltage ($V_{cross}$) selected, for example, within the intermediate region of the common-mode input voltage range. When the common-mode input voltage (average of $V_{IP}$ and $V_{IN}$) is significantly higher than $V_{cross}$, the entire tail current ($I_{tail}$) is steered toward the NMOS input pair (N1, N2) and the PMOS input pair (P1, P2) is turned "off." Conversely, when the common-mode input voltage (average of $V_{IP}$ and $V_{IN}$) is significantly lower than $V_{cross}$, the entire tail current ($I_{tail}$) is steered toward the PMOS input pair (P1, P2) and the NMOS input pair (N1, N2) is turned "off." Since there is a wide range of choice for $V_{cross}$ within the intermediate CMV region, either the operating range of the PMOS input pair (P1, P2) or the NMOS input pair (N1, N2) can be maximized. When low common mode voltages (e.g., voltages close to ground) are preferred, the operating range of the PMOS input pair (P1, P2) can be maximized by setting $V_{cross}$ close to $V_{DD}-(2V_{Odp}+|V_{THp}|)$, where $V_{Odp}$ and $V_{THp}$ are the over-drive voltage and threshold voltage respectively of the PMOS input pair.

Compared to the CMOS input stage 100 shown in FIG. 1 (Prior Art), the CMOS input stage 200 shown in FIG. 2 (Prior Art) offers a larger input range for which the input voltage excites only one input pair (either the NMOS or PMOS input pair), and hence, maximizes the linear voltage range. Because only one input pair is excited at a time, the common-mode input voltage (CMV) range of the input stage shown in FIG. 2 (Prior Art) can be divided into two regions: (1) a low CMV region including voltages lower than $V_{cross}$ (where the PMOS input pair is "on") and (2) a high CMV region including voltages higher than $V_{cross}$ (where the NMOS input pair is "on"). Unlike the circuit implementation shown in FIG. 1 (Prior Art), which includes three distinct $g_m$ regions, the CMOS input stage 200 shown in FIG. 2 (Prior Art) has two main $g_m$ regions (i.e., $g_{mp}$ in the low CMV region, and $g_{mn}$ in the high CMV region), and an intermediate $g_m$ region that is relatively reduced compared to FIG. 1 (Prior Art). If $g_{mn}=\sqrt{K_n I}$ is set equal to $g_{mp}=\sqrt{K_p I}$ (by choosing $k_n = k_p$), CMOS input stage 200 appears, at first glance, to provide near constant $g_m$ over the entire common-mode input voltage range.

For example, when the common-mode input voltage (average of $V_{IP}$ and $V_{IN}$) is substantially higher than $V_{cross}$, most of the tail current ($I_{tail}$) is steered toward the NMOS input pair (N1, N2) and $g_{mn} = \sqrt{k_n I}$. When the common-mode input voltage is substantially lower than $V_{cross}$, most of the tail current is steered toward the PMOS input pair (P1, P2) and $g_{mp} = \sqrt{k_p I}$. However, a problem occurs at the boundary region when the common-mode input voltage is substantially equal to $V_{cross}$ (e.g., within approximately 20% of $V_{cross}$), and the tail current is switched from the PMOS input pair to the NMOS input pair, or vice versa. If the input common-mode voltage is equal to $V_{cross}$, one-half of the tail current will flow through the NMOS input pair (N1, N2), while the other half of the tail current flows through the PMOS input pair (P1, P2). When this occurs, the transconductance of the NMOS input pair and the transconductance of the PMOS input pair at the $V_{cross}$ boundary region:

$$g_{mn,cross} = \sqrt{k_n I/2} = \frac{g_{mn}}{\sqrt{2}} = \frac{g_m}{\sqrt{2}}$$

$$g_{mp,cross} = \sqrt{k_p I/2} = \frac{g_{mp}}{\sqrt{2}} = \frac{g_m}{\sqrt{2}}$$

combine to produce a net transconductance of $g_{mn,cross} + g_{mp,cross} = \sqrt{2} g_m$. Thus, as the common-mode input voltage is swept, CMOS input stage 200 still provides inconsistent $g_m$ when transitioning across the $V_{cross}$ boundary region. The $g_m$ inconsistency at the boundary region causes the unity-gain bandwidth (UGB) to change over the common-mode input voltage range, which is an undesirable behavior in amplifier designs. The variable UGB, in turn, causes another undesirable phenomenon, as set forth below.

In some cases, a single stage of gain may not be enough, and a second stage may be cascaded with the first stage to produce a two-stage operational amplifier with a sufficient amount of gain. FIG. 3 (Prior Art) is a simplified circuit diagram of a two-stage operational amplifier 300 with Miller compensation. If Miller compensation is used, the dominant pole comes from the compensation capacitor ($C_C$) and the non-dominant pole comes from the load capacitor ($C_L$) located at the output of the second stage. The unity-gain bandwidth (UGB) of the operational amplifier 300 is $\omega_u = g_{m1}/C_C$, and thus, is dependent on the transconductance ($g_{m1}$) of the first input stage. To ensure 60° phase margin (i.e., lowest power solution), the transconductance ($g_{m2}$) of the second stage and the location of the second pole, $\omega_2 = g_{m2}/C_L$, is set equal to twice the UGB of the first input stage (i.e., $2\omega_u$). Unfortunately, when CMOS input stage 200 is used in the first stage of the two-stage operational amplifier 300 shown in FIG. 3 (Prior Art), the $\sqrt{2}$ increase in the first stage transconductance ($g_{m1}$) at the $V_{cross}$ boundary poses a problem in terms of phase margin.

FIG. 4 (Prior Art) is a graph plotting phase margin and phase margin frequency (UGB) vs. common-mode input voltage for the two-stage operational amplifier 300 shown in FIG. 3 (Prior Art) when the CMOS input stage 200 shown in FIG. 2 (Prior Art) is used in the first stage of the amplifier. As shown in FIG. 4 (Prior Art), the $\sqrt{2}$ increase in $g_{m1}$ at the $V_{cross}$ boundary causes an approximately 8° drop in phase margin from the desired 60° phase margin in the voltage region surrounding $V_{cross}$ (e.g., 0.7 V). This drop in phase margin directly and negatively impacts the stability of the circuit.

One method to combat phase margin degradation in the first stage of a two-stage amplifier is to increase the transconductance ($g_{m2}$) of the second stage to provide a phase margin of, for example, 70°. For example, if CMOS input stage 200 is used in the first stage of the operational amplifier 300, and the phase margin degrades by approximately 8°, increasing the second stage transconductance ($g_{m2}$) should provide enough margin to maintain the desired 60° phase margin. However, increasing the second stage transconductance ($g_{m2}$) consumes more power, and thus, is not an acceptable solution in low-power amplifier designs and applications.

SUMMARY

The present disclosure provides various embodiments of improved CMOS input stage circuits and related methods to maintain a near constant transconductance ($g_m$), and thereby prevent a phase margin drop, in a voltage region surrounding a cross-over voltage ($V_{cross}$) boundary between a low common-mode voltage (CMV) region and a high CMV region. The following description of various embodiments of CMOS input stage circuits and related methods represent example embodiments and is not to be construed in any way as limiting the subject matter of the appended claims.

According to one embodiment, a CMOS input stage circuit provided herein may generally include a pair of NMOS input transistors (N1, N2), a first pair of PMOS input transistors (P1, P2), a first current source, a current steering circuit and a current stealing circuit. Differential input voltages may be supplied to gate terminals of the pair of NMOS input transistors (N1, N2) and the first pair of PMOS input transistors (P1, P2). The first current source may be coupled to source terminals of the first pair of PMOS input transistors (P1, P2) and may be configured to generate a first current. The current steering circuit may be configured to steer the first current to the pair of NMOS input transistors (N1, N2) and/or to the first pair of PMOS input transistors (P1, P2), depending on whether a common-mode input voltage is significantly greater than, significantly less than or substantially equal to a cross-over voltage. The current stealing circuit may be configured to steal a portion of the first current, so that a smaller remaining portion of the first current is divided among the pair of NMOS input transistors (N1, N2) and to the first pair of PMOS input transistors (P1, P2) when the common-mode input voltage is substantially equal to the cross-over voltage.

In some embodiments, the pair of NMOS input transistors (N1, N2) may have source terminals that are coupled together and drain terminals coupled to a first current summation circuit (P3, P4, P5, P6) of the CMOS input stage circuit. Likewise, the first pair of PMOS input transistors (P1, P2) may have source terminals that are connected together and drain terminals coupled to a second current summation circuit (N3, N4, N5, N6) of the CMOS input stage circuit.

In some embodiments, the current steering circuit may include a first PMOS transistor (P7) and a first NMOS current mirror (N7, N8). The first PMOS transistor (P7) may have a source terminal coupled to the source terminals of the first pair of PMOS input transistors (P1, P2) and a gate terminal coupled to receive the cross-over voltage. The first NMOS current mirror (N7, N8) may be coupled between a drain terminal of the first PMOS transistor (P7) and source terminals of the pair of NMOS input transistors (N1, N2). When the common-mode input voltage is significantly greater than the cross-over voltage, the first PMOS transistor (P7) may turn on, such that the first current flows through the first PMOS transistor (P7) and is mirrored by the first NMOS current mirror (N7, N8) to the source terminals of the pair of NMOS input transistors (N1, N2). When the common-mode input voltage is significantly less than the cross-over voltage, the first PMOS transistor (P7) may turn off and the first current may be supplied to the source terminals of the first pair of PMOS input transistors (P1, P2). When the common-mode input voltage is substantially equal to the cross-over voltage, however, the first PMOS transistor (P7) may partially turn on, such that a first portion of the remaining portion of the first current is supplied to the pair of NMOS input transistors (N1, N2) and a second portion of the remaining portion of the first current is supplied to the first pair of PMOS input transistors (P1, P2).

In some embodiments, the current stealing circuit may include a second pair of PMOS input transistors (P9, P10), a second current source, a second PMOS transistor (P8) and a second NMOS current mirror (N9, N10). The second pair of PMOS input transistors (P9, P10) may have source terminals that are connected together and gate terminals coupled to receive the differential input voltage. The second current source may be coupled to the source terminals of the second pair of PMOS input transistors (P9, P10) and may be configured to generate a second current. The second PMOS transistor (P8) may have a source terminal coupled to the source terminals of the first pair of PMOS input transistors (P1, P2) and a gate terminal coupled to receive the cross-over voltage. The second NMOS current mirror (N9, N10) may be coupled between drain terminals of the second pair of PMOS input transistors (P9, P10) and a drain terminal of the second PMOS transistor (P8).

In some embodiments, the second NMOS current mirror (N9, N10) may act like a current source for generating a stolen current, which is stolen from the first current ($I_1$), when the common-mode input voltage is substantially equal to the cross-over voltage, and the second PMOS transistor (P8) may act like a switch to turn the stolen current on/off. When the common-mode input voltage is greater than or equal to the cross-over voltage, for example, the second PMOS transistor (P8) may turn on to conduct the stolen current. When the common-mode input voltage is less than the cross-over voltage, the second PMOS transistor (P8) may turn off to cut off the stolen current. In some embodiments, the stolen current generated by the second NMOS current mirror (N9, N10) may be substantially equal to about one-quarter to about one-half of the first current.

In some embodiments, the current stealing circuit may further include a third PMOS transistor (P11) and a third NMOS transistor (N11). The third PMOS transistor (P11) may have a source terminal coupled to the source terminals of the second pair of PMOS transistors (P9, P10) and a gate terminal coupled to receive the cross-over voltage. The third NMOS transistor (N11) may have gate and drain terminals coupled to the drain terminal of the third PMOS transistor (P11) and a source terminal coupled to ground (or $V_{SS}$).

In some embodiments, the third PMOS transistor (P11) may be configured to prevent or allow the second current to flow through the second pair of PMOS input transistors (P9, P10) to the second NMOS current mirror (N9, N10), depending on whether the common-mode input voltage is greater than or less than the cross-over voltage. When the common-mode input voltage is significantly greater than the cross-over voltage, for example, the third PMOS transistor (P11) may turn on to prevent the second current from flowing through the second pair of PMOS input transistors (P9, P10) to the second NMOS current mirror (N9, N10), which prevents the second NMOS current mirror (N9, N10) from generating the stolen current. Thus, the stolen current is zero when the common-mode input voltage is greater than the cross-over voltage.

When the common-mode input voltage is significantly less than the cross-over voltage, the third PMOS transistor (P11) may turn off to allow the second current to flow through the second pair of PMOS input transistors (P9, P10) to the second NMOS current mirror (N9, N10), which enables the second NMOS current mirror (N9, N10) to generate the stolen current. However, the second PMOS transistor (P8) may turn off to cut off the stolen current when the common-mode input voltage is less than the cross-over voltage. Thus, the stolen current is zero when the common-mode input voltage is less than the cross-over voltage.

When the common-mode input voltage is substantially equal to the cross-over voltage, the third PMOS transistor (P11) may partially turn on to allow the second current to flow through the second pair of PMOS input transistors (P9, P10) to the second NMOS current mirror (N9, N10), which enables the second NMOS current mirror (N9, N10) to generate the stolen current. In addition, the second PMOS transistor (P8) may partially turn on to conduct the stolen current that is stolen from the first current.

According to another embodiment, a method is provided herein to maintain near constant transconductance ($g_m$) across a common-mode input voltage range of a complementary metal-oxide-semiconductor (CMOS) input stage circuit. The CMOS input stage circuit may be generally configured as described above.

In some embodiments, the method may include supplying differential input voltages to gate terminals of the pair of NMOS input transistors (N1, N2) and the first pair of PMOS input transistors (P1, P2); steering a first current to the pair of NMOS input transistors (N1, N2) and/or to the first pair of PMOS input transistors (P1, P2), depending on whether a common-mode input voltage is significantly greater than, significantly less than or substantially equal to a cross-over voltage; and stealing a portion of the first current, so that a smaller remaining portion of the first current is divided among the pair of NMOS input transistors (N1, N2) and the first pair of PMOS input transistors (P1, P2) when the common-mode input voltage is substantially equal to the cross-over voltage to maintain near constant transconductance ($g_m$) across the common-mode input voltage range of the CMOS input stage circuit. In some embodiments, the method may further include maintaining the first current supplied to the pair of NMOS input transistors (N1, N2) or to the first pair of PMOS input transistors (P1, P2) when the common-mode input voltage is significantly greater than or significantly less than the cross-over voltage, respectively.

In some embodiments, said steering a first current may generally include steering the first current to the pair of NMOS input transistors (N1, N2) when the common-mode input voltage is significantly greater than the cross-over voltage; steering the first current to the first pair of PMOS input transistors (P1, P2) when the common-mode input voltage is significantly less than the cross-over voltage; and steering a first portion of the remaining portion of the first current to the pair of NMOS input transistors (N1, N2) and a second portion of the remaining portion of the first current to the first pair of PMOS input transistors (P1, P2) when the common-mode input voltage is substantially equal to the cross-over voltage.

In some embodiments, said stealing a portion of the first current may generally include stealing a portion of the first current only when the common-mode input voltage is substantially equal to the cross-over voltage. This may be achieved, in one embodiment, by partially turning on the third PMOS transistor (P11) to allow the second current to flow through the second pair of PMOS input transistors (P9, P10) to the second NMOS current mirror (N9, N10), which enables the second NMOS current mirror (N9, N10) to generate the stolen current; and partially turning on the second PMOS transistor (P8) to conduct the stolen current, which is stolen from the first current.

In some embodiments, said maintaining the first current may include maintaining the first current supplied to the pair of NMOS input transistors (N1, N2) when the common-mode input voltage is significantly greater than the cross-over voltage. This may be achieved, in one embodiment, by turning on the third PMOS transistor (P11) to prevent the second current from flowing through the second pair of PMOS input transistors (P9, P10) to the second NMOS current mirror (N9, N10). This prevents the second NMOS current mirror (N9, N10) from generating the stolen current, thereby maintaining the first current supplied to the pair of NMOS input transistors (N1, N2).

In some embodiments, said maintaining the first current may include maintaining the first current supplied to the first pair of PMOS input transistors (P1, P2) when the common-mode input voltage is significantly less than the cross-over voltage. This may be achieved, in one embodiment, by turning off the third PMOS transistor (P11) and the second PMOS transistor (P8). Turning off the third PMOS transistor (P11) allows the second current to flow through the second pair of PMOS input transistors (P9, P10) to the second NMOS current mirror (N9, N10), which enables the second NMOS current mirror (N9, N10) to generate the stolen current. Turning off the second PMOS transistor (P8) cuts off the stolen current and maintains the first current supplied to the first pair of PMOS input transistors (P1, P2).

BRIEF DESCRIPTION OF THE DRAWINGS

Other objects and advantages of the invention will become apparent upon reading the following detailed description and upon reference to the accompanying drawings.

Figure 1:
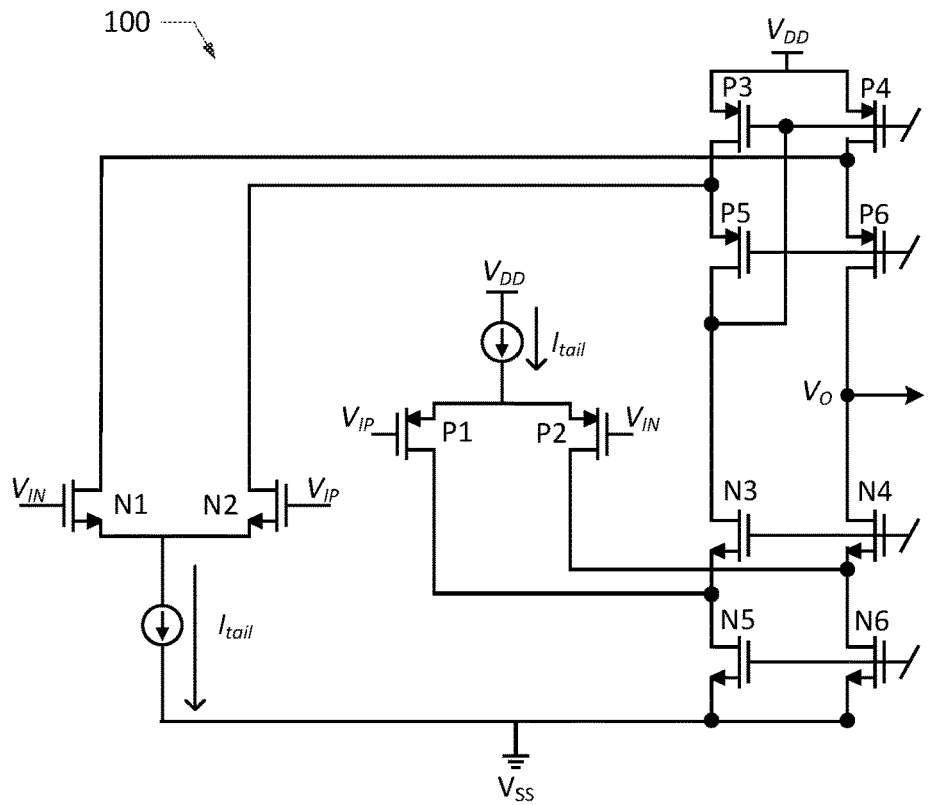
FIG. 1 (Prior Art) is a circuit diagram illustrating a complementary metal-oxide-semiconductor (CMOS) input stage for an operational amplifier, where the CMOS input stage include a PMOS input pair and NMOS input pair.

While the present disclosure is susceptible to various modifications and alternative forms, specific embodiments thereof are shown by way of example in the drawings and will herein be described in detail. It should be understood, however, that the drawings and detailed description thereto are not intended to limit the present disclosure to the particular form disclosed, but on the contrary, the intention is to cover all modifications, equivalents and alternatives falling within the spirit and scope of the present disclosure as defined by the appended claims.

DETAILED DESCRIPTION OF THE PREFERRED EMBODIMENTS

Generally speaking, the present disclosure provides various embodiments of improved CMOS input stage circuits and related methods to maintain a near constant transconductance ($g_m$) in a voltage region surrounding a cross-over voltage ($V_{cross}$) boundary between a low common-mode voltage (CMV) region and a high CMV region. Unlike conventional CMOS input stage circuits, the CMOS input stage circuit described herein uses a current steering circuit to steer the tail current between the complementary input pairs, and a current stealing circuit to reduce a current supplied to the complementary input pairs when the CMV is close to a cross-over voltage ($V_{cross}$).

In the embodiments disclosed herein, the current stealing circuit may be activated to steal a portion of the tail current only when the common-mode input voltage (the average of $V_{IP}$ and $V_{IN}$) supplied to the complementary input pairs of the CMOS input stage circuit is within the near voltage region surrounding the cross-over voltage ($V_{cross}$). In some embodiments, the near voltage region surrounding $V_{cross}$ includes the $V_{cross}$ boundary, and may comprise approximately 20% (or more) of the common mode voltage range (e.g., 0-$V_{DD}$). As such, the CMOS input stage circuit disclosed herein improves upon conventional CMOS input stage circuits by maintaining a near constant $g_m$ across the entire common-mode input voltage range, including the $V_{cross}$ boundary when the tail current is steered from one complementary input pair to the other. In doing so, the disclosed CMOS input stage circuit significantly limits the phase margin drop, which typically occurs in the near voltage region surrounding the $V_{cross}$ boundary when the conventional CMOS input stage circuit shown in FIG. 2 (Prior Art) is used in the first stage of a multiple-stage operational amplifier.

Figure 5:
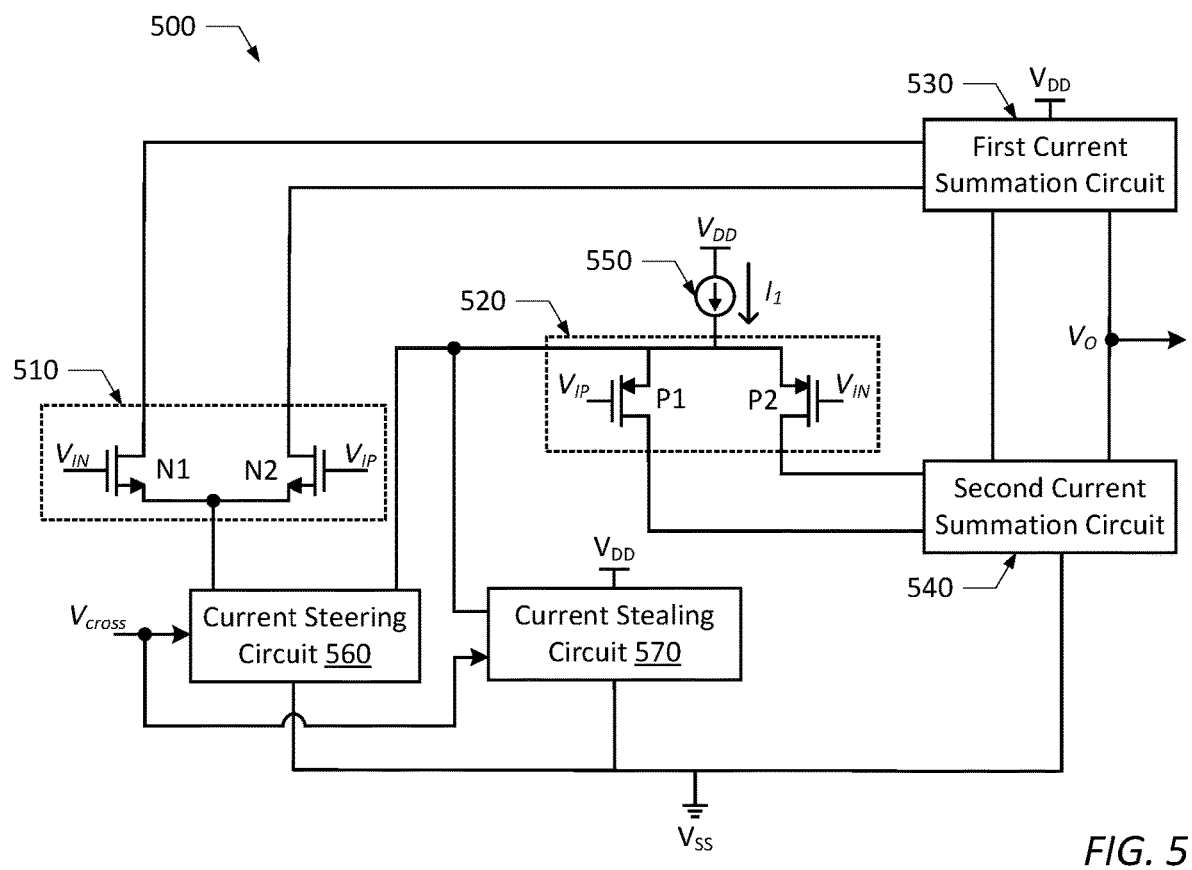
FIG. 5 is a block diagram illustrating one embodiment of an improved CMOS input stage circuit, which uses a current steering circuit to steer the tail current between the complementary input pairs, and a current stealing circuit to reduce a current supplied to the complementary input pairs at certain voltages.

FIG. 5 is a block diagram illustrating one embodiment of an improved CMOS input stage circuit 500 in accordance with the present disclosure. Similar to the conventional circuit implementations shown in FIGS. 1 and 2, CMOS input stage circuit 500 includes an NMOS input pair 510 and a first PMOS input pair 520, each of which is coupled in parallel. NMOS input pair 510 includes a pair of NMOS input transistors (N1, N2) having source terminals that are coupled together, gate terminals coupled to receive differential input voltages ($V_{IP}$ and $V_{IN}$), and drain terminals coupled to a first current summation circuit 530 of the CMOS input stage circuit. The first PMOS input pair 520 includes a first pair of PMOS input transistors (P1, P2) having source terminals that are connected together, gate terminals coupled to receive the differential input voltages ($V_{IP}$ and $V_{IN}$), and drain terminals coupled to a second current summation circuit 540 of the CMOS input stage circuit. The current summation circuits 530 and 540 sum the drain currents of N2 and P1, and N1 and P2, with correct polarity, to produce an output voltage ($V_O$) for the CMOS input stage circuit 500.

A first current source 550 is coupled to supply a tail current (i.e., a first current, $I_1$) to the commonly connected source terminals of the first pair of PMOS input transistors (P1, P2) of CMOS input stage circuit 500. In some embodiments, the tail current ($I_1$) may be approximately equal to 2I, such that one-half (I) of the tail current may be supplied to the source terminal of PMOS input transistor P1, while the other half (I) of the tail current may be supplied to the source terminal of PMOS input transistor P2.

Figure 2:
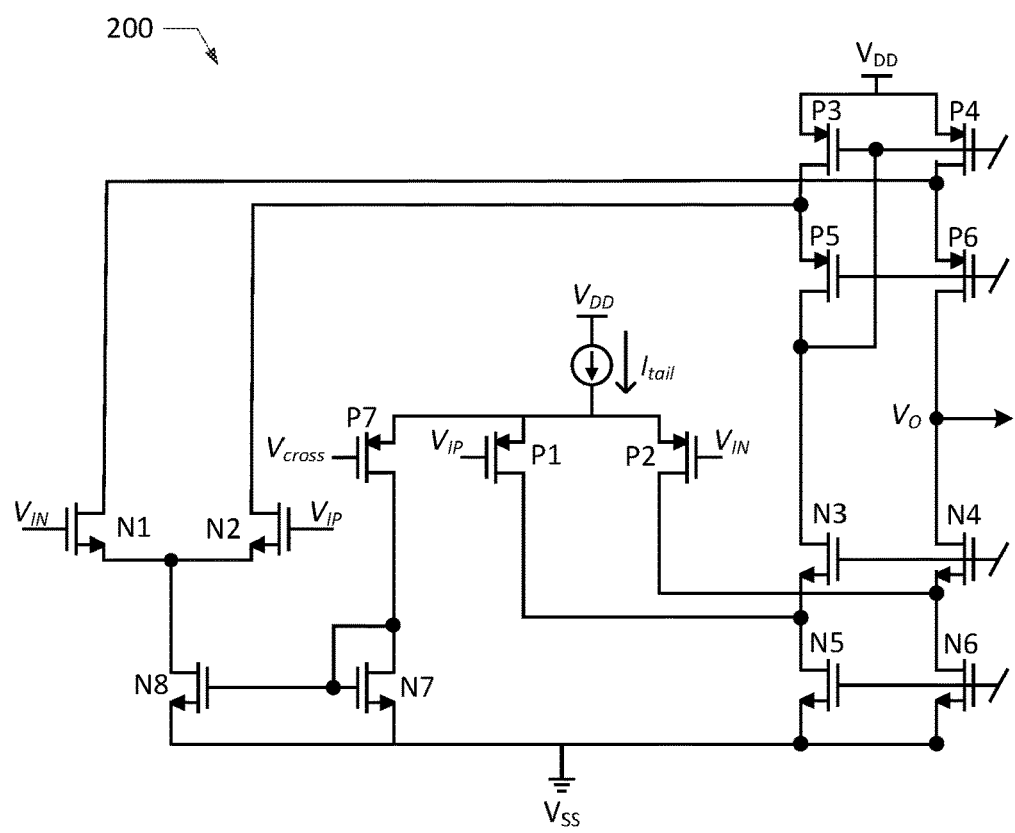
FIG. 2 (Prior Art) is a circuit diagram illustrating another CMOS input stage, which uses a current steering circuit to steer the tail current ($I_{tail}$) away from one of the complementary input pairs.
Figure 6:
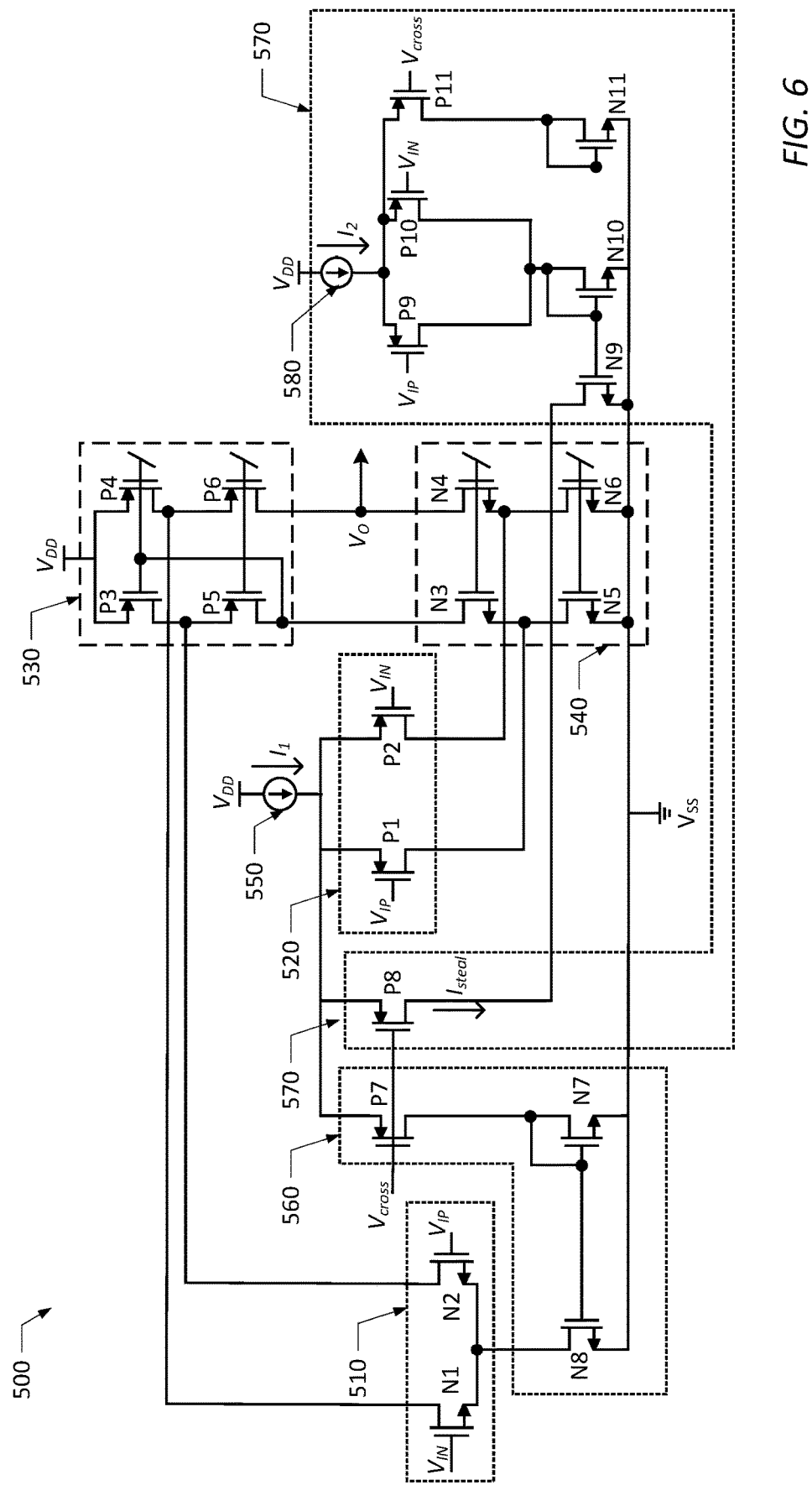
FIG. 6 is a simplified circuit diagram illustrating one example implementation of the CMOS input stage circuit shown in FIG. 5.

Similar to the CMOS input stage circuit 200 shown in FIG. 2 (Prior Art), CMOS input stage circuit 500 includes a current steering circuit 560, which is configured to steer the tail current (i.e., the first current, $I_1$) to the pair of NMOS input transistors (N1, N2) and/or the first pair of PMOS input transistors (P1, P2), depending on whether the common-mode input voltage is significantly greater than, significantly less than or substantially equal to a cross-over voltage ($V_{cross}$). One embodiment of current steering circuit 560 is shown in FIG. 6 and described in more detail below.

Current steering circuit 560 maximizes the linear voltage range of CMOS input stage circuit 500 by turning "on" only one input pair (either NMOS input pair 510 or PMOS input pair 520) at a time. Because only one input pair is excited at a time, the common-mode input voltage (CMV) range of CMOS input stage circuit 500 is divided into: (1) a low CMV region including voltages lower than $V_{cross}$ (where only PMOS input pair 520 is "on"), and (2) a high CMV region including voltages higher than $V_{cross}$ (where only NMOS input pair 510 is "on"). The transconductance ($g_m$) of CMOS input stage circuit 500 can, therefore, be expressed as $g_{mp} = \sqrt{K_p I}$ the low CMV region and $g_{mn} = \sqrt{K_n I}$ in the high CMV region. If $g_{mn} = \sqrt{K_n I}$ is set equal to $g_{mp} = \sqrt{K_p I}$ (e.g., by choosing $k_n = k_p$), the transconductance of CMOS input stage circuit 500 will be relatively constant in these two regions.

Unlike the CMOS input stage circuit 200 shown in FIG. 2 (Prior Art), the transconductance ($g_m$) of CMOS input stage circuit 500 remains constant, even when the common-mode input voltage (the average of $V_{IP}$ and $V_{IN}$) is within a near voltage region surrounding the cross-over voltage ($V_{cross}$) and the tail current ($I_1$) switches from the first PMOS input pair (P1, P2) to the NMOS input pair (N1, N2), or vice versa. In some embodiments, the near voltage region surrounding $V_{cross}$ includes the $V_{cross}$ boundary, and may comprise approximately 20% (or more) of the common mode voltage range (e.g., 0-$V_{DD}$).

In order to maintain a near constant $g_m$ within the $V_{cross}$ boundary region (i.e., the near voltage region surrounding the $V_{cross}$ boundary between the low CMV region and the high CMV region), CMOS input stage circuit 500 includes a current stealing circuit 570 to steal a portion of the tail current ($I_1$) generated by the current source 550 when the common-mode input voltage is substantially equal to $V_{cross}$. In doing so, the current stealing circuit 570 shown in FIG. 5 avoids the $\sqrt{2}$ increase in $g_m$ that occurs in the $V_{cross}$ boundary region in the CMOS input stage circuit 200 shown in FIG. 2 (Prior Art), and thus, provides near constant $g_m$ across the entire common-mode input voltage range (e.g., 0-$V_{DD}$) of the CMOS input stage circuit 500. This enables CMOS input stage circuit 500 to reduce or limit the undesirable phase margin drop (see, FIG. 4 (Prior Art)) that occurs near the $V_{cross}$ boundary when the CMOS input stage 200 shown in FIG. 2 (Prior Art) is used in the first stage of a two-stage operational amplifier, as shown for example in FIG. 3 (Prior Art).

FIG. 6 is a simplified circuit diagram of CMOS input stage circuit 500 in accordance with embodiment of the present disclosure. Similar to the block diagram shown in FIG. 5, the CMOS input stage circuit 500 implementation shown in FIG. 6 includes an NMOS input pair 510, a first PMOS input pair 520, a first current summation circuit 530, a second current summation circuit 540, a first current source 550, a current steering circuit 560 and a current stealing circuit 570. The NMOS input pair 510, the first PMOS input pair 520, the first current summation circuit 530, the second current summation circuit 540 and the first current source 550 are coupled and configured as described above. Example circuit implementations for the current steering circuit 560 and the current stealing circuit 570 are shown in FIG. 6 and described in more detail below.

According to one embodiment, current steering circuit 560 may generally include a first PMOS transistor (P7), which is coupled in parallel with the first PMOS input pair (P1, P2), and a first NMOS current mirror (N7, N8), which is coupled between the drain terminal of the first PMOS transistor (P7) and the commonly connected source terminals of the NMOS input pair (N1, N2). More specifically, and shown in FIG. 6, the first PMOS transistor (P7) has a source terminal coupled to the source terminals of the first pair of PMOS input transistors (P1, P2), and a gate terminal coupled to receive the cross-over voltage ($V_{cross}$). In some embodiments, the cross-over voltage ($V_{cross}$) may be selected from within the intermediate CMV region (e.g., ($2V_{Odn}+V_{THn}$)<CMV<($V_{DD}-(2V_{Odp}+2|V_{THp}|)$)) of the common-mode input voltage range of the CMOS input stage 100 shown in FIG. 1 (Prior Art). The first NMOS current mirror (N7, N8) is coupled between a drain terminal of the first PMOS transistor (P7) and the source terminals of the pair of NMOS input transistors (N1, N2).

As noted above, current steering circuit 560 is configured to steer the tail current (i.e., the first current, $I_1$) to the NMOS input pair (N1, N2) and/or to the first PMOS input pair (P1, P2), depending on whether the common-mode input voltage is significantly greater than, significantly less than or substantially equal to the cross-over voltage ($V_{cross}$). When the common-mode input voltage is significantly less than $V_{cross}$, for example, the first PMOS transistor (P7) turns "off" to steer the tail current ($I_1$) toward the first PMOS input pair (P1, P2) and turn "off" the NMOS input pair (N1, N2). When the common-mode input voltage is significantly greater than $V_{cross}$, the first PMOS transistor (P7) turns "on" to steer the tail current ($I_1$) toward the NMOS input pair (N1, N2) and turn "off" the first PMOS input pair (P1, P2). When PMOS transistor P7 is "on," the tail current ($I_1$) flows through PMOS transistor P7 and is mirrored by the first NMOS current mirror (N7 and N8) to the source terminals of the NMOS transistors (N1, N2) in the NMOS input pair.

When the common-mode input voltage is substantially equal to $V_{cross}$, the first PMOS transistor (P7) partially turns "on," such that a first portion of the tail current ($I_1$) is supplied to the pair of NMOS input transistors (N1, N2) and a second portion of the tail current ($I_1$) is supplied to the first pair of PMOS input transistors (P1, P2). In some embodiments, the tail current ($I_1$) may be approximately equal to 2I. In such embodiments, less than one-half ($I-I_{steal}/2$) of the tail current may be supplied to the pair of NMOS input transistors (N1, N2), while the other half ($I-I_{steal}/2$) of the tail current is supplied to the first pair of PMOS input transistors (P1, P2) when the common-mode input voltage is substantially equal to $V_{cross}$.

As noted above, there is a wide range of voltages within the intermediate CMV region, which can be used to set $V_{cross}$ and maximize either the operating range of the first PMOS input pair (P1, P2) or the operating range of the NMOS input pair (N1, N2). When relatively low voltages (e.g., voltages close to ground) are preferred, the operating range of the first PMOS input pair (P1, P2) can be maximized by setting $V_{cross}$ close to $V_{DD}$ ($2V_{Odp}+|V_{THp}|$), where $V_{Odp}$ and $|V_{THp}|$ are the over-drive voltage and threshold voltage respectively of the PMOS transistors. When relatively high voltages (e.g., voltages close to $V_{DD}$) are preferred, the operating range of the NMOS input pair (N1, N2) can be maximized by setting $V_{cross}$ close to ($2V_{Odn}+V_{THn}$), where $V_{Odn}$ and $V_{THn}$ are the over-drive voltage and threshold voltage respectively of the NMOS transistors.

According to one embodiment, current stealing circuit 570 may generally include a second PMOS input pair (P9, P10), a second current source 580, a second PMOS transistor (P8), a second NMOS current mirror (N9 and N10), a third PMOS transistor (P11) and a third NMOS transistor (N11). More specifically, and shown in FIG. 6, the second PMOS input pair includes a second pair of PMOS transistors (P9 and P10) having source terminals that are connected together, gate terminals that are coupled to receive the common-mode input voltage, and drain terminals that are connected together. The second current source 580 is coupled to supply a tail current (i.e., a second current, $I_2$) to the source terminals of the PMOS transistors (P9 and P10) in the second PMOS input pair. In some embodiments, the tail current ($I_2$) may be approximately equal to 2I, such that one-half (I) of the tail current is supplied to the source terminal of PMOS transistor P9, while the other half (I) of the tail current is supplied to the source terminal of PMOS transistor P10. The drain terminals of the PMOS transistors (P9 and P10) in the second PMOS input pair are coupled to the gate and drain terminals of NMOS transistor N10 in the second NMOS current mirror.

The second PMOS transistor P8 has a source terminal coupled to the source terminals of the PMOS input transistors (P1, P2) in the first PMOS input pair, a gate terminal coupled to receive the cross-over voltage ($V_{cross}$) supplied to PMOS transistor P7, and a drain terminal coupled to the drain terminal of NMOS transistor N9 in the second NMOS current mirror (N9 and N10). The second NMOS current mirror (N9, N10) is coupled between drain terminals of the PMOS input transistors (P9, P10) in the second PMOS input pair, and a drain terminal of the second PMOS transistor (P8). More specifically, the drain terminal of NMOS transistor N9 is coupled to drain terminal of the second PMOS transistor (P8). The gate terminal of NMOS transistor N9 is coupled to the gate and drain terminals of NMOS transistor N10. The gate and drain terminals of NMOS transistor N10 are coupled to the drain terminals of the PMOS transistors (P9 and P10) in second PMOS input pair. The source terminals of NMOS transistors N9 and N10 are coupled to ground (or $V_{SS}$).

As described in more detail below, the NMOS transistor N9 in the second NMOS current mirror (N9, N10) acts like a current source for generating a stolen current ($I_{steal}$), which is stolen from the tail current ($I_1$) generated by the first current source 550 when the common-mode input voltage is within a near voltage region surrounding the cross-over voltage ($V_{cross}$), and the second PMOS transistor (P8) acts like a soft switch to turn the stolen current on/off. For example, PMOS transistor P8 may turn "on" (i.e., the switch may be closed) to conduct the $I_{steal}$ current when the common-mode input voltage is relatively close to $V_{cross}$, and may turn "off" (i.e., the switch may be opened) to cut off the stolen current when the common-mode input voltage is significantly less than $V_{cross}$. When the common-mode input voltage is significantly greater than $V_{cross}$, PMOS transistor P8 may turn "on." However, since the third PMOS transistor P11 also turns "on" when the common-mode input voltage is significantly greater than $V_{cross}$, the stolen current ($I_{steal}$) will diminish.

The mirroring ratio between current mirror transistors N9 and N10 may generally be selected to control the amount of $I_{steal}$ current stolen from the tail current ($I_1$) when the common-mode input voltage is substantially equal to $V_{cross}$. In some embodiments, current mirror transistors N9 and N10 may be sized to generate a stolen current ($I_{steal}$) substantially equal to about one-quarter of the tail current (i.e., about ¼ $I_1$ when the input transistors are in moderate inversion) and one-half of the tail current (i.e., about ½ $I_1$ when the input transistors are in strong inversion).

The third PMOS transistor P11 is coupled in parallel with the second PMOS input pair (P9, P10) and configured to receive the cross-over voltage ($V_{cross}$) supplied to PMOS transistors P7 and P8. More specifically, the third PMOS transistor P11 has a source terminal coupled to the source terminals of PMOS transistors (P9 and P10) in the second PMOS input pair, a gate terminal coupled to receive $V_{cross}$, and a drain terminal coupled to the gate and drain terminals of the third NMOS transistor N11. The source terminal of the third NMOS transistor N11 is coupled to ground (or $V_{SS}$). As described in more detail below, the third PMOS transistor P11 may be generally configured to prevent or allow tail current (i.e., a second current, $I_2$) from the second current source 580 to flow through the PMOS transistors (P9, P10) of the second PMOS input pair to the NMOS transistor N10 in the second NMOS current mirror (N9, N10), depending on whether the common-mode input voltage is greater than or less than the cross-over voltage ($V_{cross}$).

As noted above, current stealing circuit 570 is configured to steal a portion of the tail current (i.e., the first current, $I_1$) generated by the first current source 550 when the common-mode input voltage supplied to the NMOS input pair (N1, N2), the first PMOS input pair (P1, P2) and the second PMOS input pair (P9, P10) is substantially equal to the cross-over voltage ($V_{cross}$).

When the common-mode input voltage is significantly higher than $V_{cross}$, the third PMOS transistor P11 turns "on" and the second PMOS transistor P8 turns "on" (i.e., the current stealing switch closes). When PMOS transistor P11 is "on," the tail current ($I_2$) from the second current source 580 is prevented from flowing through the PMOS transistors (P9 and P10) in the second PMOS input pair to the NMOS transistors (N9 and N10) in the second NMOS current mirror. Since no current flows through NMOS transistor N10, $I_{steal}=0$ when the common-mode input voltage is significantly greater than $V_{cross}$.

When the common-mode input voltage is significantly lower than $V_{cross}$, the third PMOS transistor (P11) turns "off" and the second PMOS transistor (P8) turns "off" (i.e., the current stealing switch opens). When PMOS transistor P11 is "off," the tail current ($I_1$) from the second current source 580 flows through the PMOS transistors (P9 and P10) in the second PMOS input pair to NMOS transistor N10 in the second NMOS current mirror. Although current is flowing through NMOS transistor N10, the second PMOS transistor (P8) is turned "off" when the common-mode input voltage is less than $V_{cross}$ to cut off the stolen current. Thus, $I_{steal}=0$ when the common-mode input voltage is significantly lower than $V_{cross}$.

When the common-mode input voltage is substantially equal to $V_{cross}$, the third PMOS transistor P11 and the second PMOS transistor P8 partially turn "on" (i.e., the current stealing switch closes). When this occurs, the current flowing through NMOS transistor N10 is mirrored onto NMOS transistor N9 and stolen from the tail current ($I_1$). As noted above, the amount of current ($I_{steal}$) stolen from the tail current ($I_1$) may be some current value selected between about ¼ h (when the input transistors are in moderate inversion) and about ½ $I_1$ (when the input transistors are in strong inversion).

In the CMOS input stage 500 shown in FIGS. 5 and 6, the $I_{steal}$ current is zero (0) when the common-mode input voltage is significantly greater than or less than the cross-over voltage ($V_{cross}$), and is non-zero (e.g., some current value between about ¼$I_1$ and about ½$I_1$) when the common-mode input voltage is substantially equal to $V_{cross}$. When the common-mode input voltage is near $V_{cross}$, the amount of current ($I_{steal}$) stolen from the tail current is well controlled by the mirroring ratio between current mirror transistors N9 and N10, and is chosen to avoid the $\sqrt{2}$ increase in the transconductance ($g_m$) that occurs within the $V_{cross}$ boundary region in the CMOS input stage 200 shown in FIG. 2 (Prior Art). In doing so, the CMOS input stage 500 shown in FIGS. 5 and 6 maintains a near constant $g_m$ across the entire common mode voltage range, and avoids the undesirable phase margin drop (see, FIG. 4 (Prior Art)) that occurs in the $V_{cross}$ boundary region when the CMOS input stage 200 shown in FIG. 2 (Prior Art) is used in the first stage of a two-stage operational amplifier.

Figure 3:
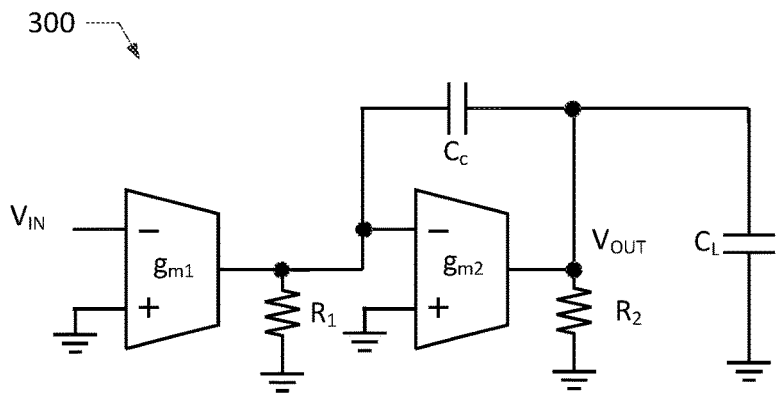
FIG. 3 (Prior Art) is a simplified circuit diagram of a two-stage operational amplifier with Miller compensation.
Figure 4:
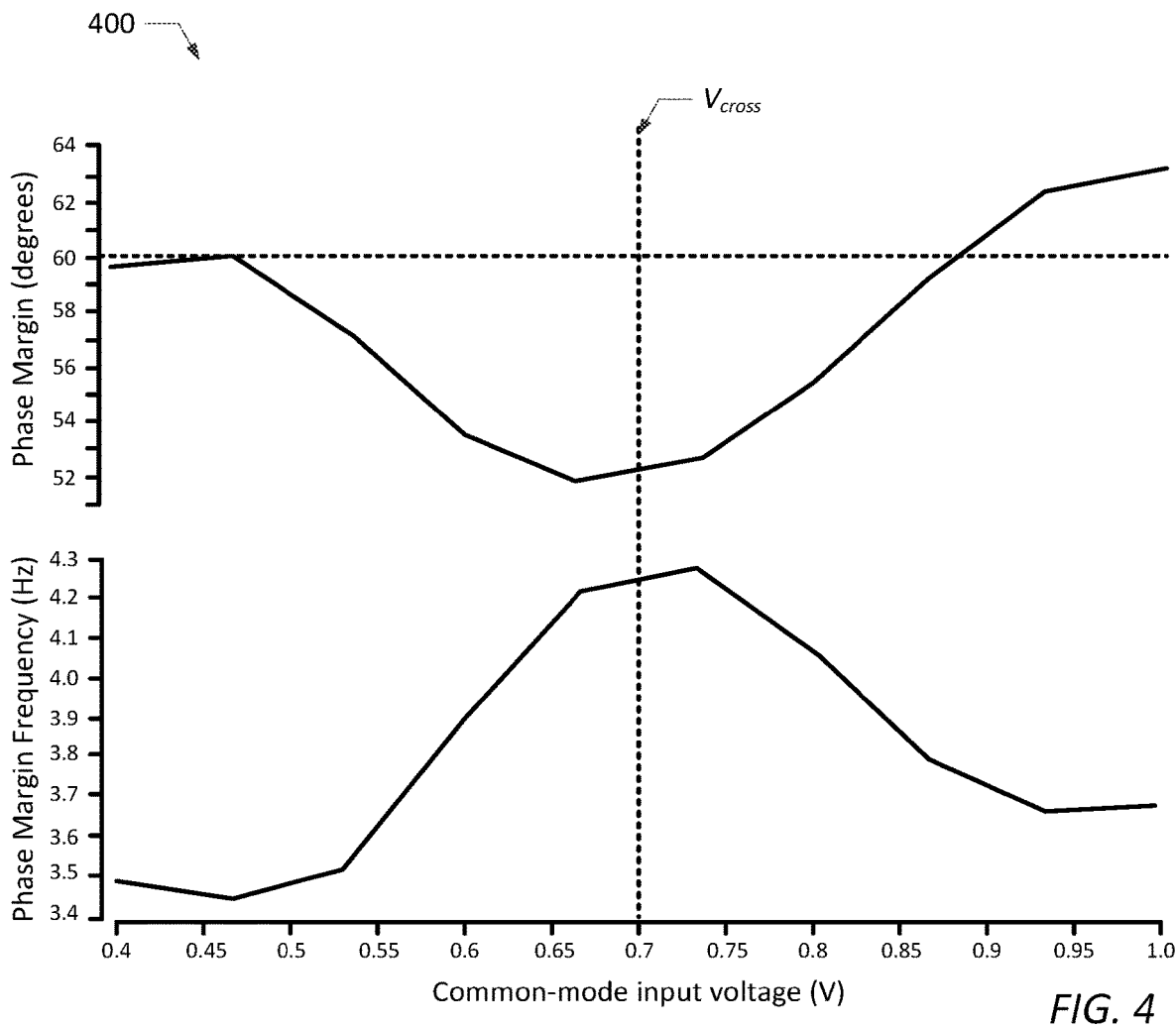
FIG. 4 (Prior Art) is a graph plotting the phase margin and phase margin frequency (UGB) vs. common-mode input voltage for the two-stage operational amplifier shown in FIG. 3 (Prior Art) configured in unity-gain feedback when the CMOS input stage shown in FIG. 2 (Prior Art) is used as the first stage of the amplifier.
Figure 7:
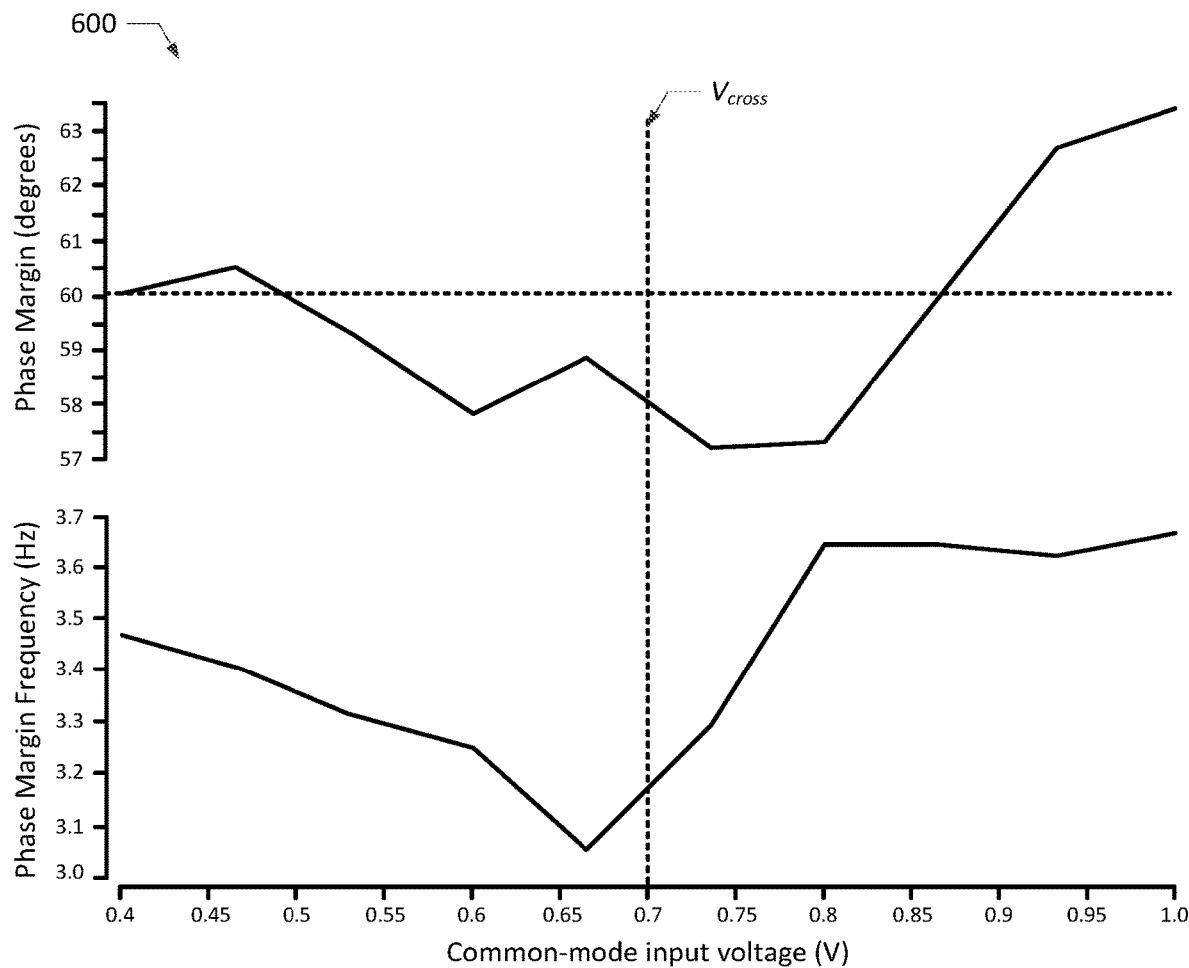
FIG. 7 is a graph plotting the phase margin and phase margin frequency (UGB) vs. common mode input voltage for the two-stage operational amplifier shown in FIG. 3 (Prior Art) configured in unity-gain feedback when the CMOS input stage circuit shown in FIGS. 5 and 6 is used in the first stage of the amplifier.

FIG. 7 is a graph 600 illustrating phase margin and phase margin frequency (UGB) vs. common mode input voltage for the two-stage operational amplifier 300 shown in FIG. 3 (Prior Art) when the CMOS input stage 500 shown in FIGS. 5 and 6 is used in the first stage of the amplifier. As shown in FIG. 7, the phase margin degradation provided by CMOS input stage 500 is less than 3° in the voltage region near the $V_{cross}$ boundary (e.g., 0.7 V), which is significantly better than the 8° drop in phase margin provided by CMOS stage 200 (see, FIG. 4 (Prior Art)). In some embodiments, the phase margin degradation provided by CMOS input stage 500 can be tuned (e.g., increased or decreased) by changing the mirroring ratio between current mirror transistors N9 and N10 to control the amount of current ($I_{steal}$) stolen from the tail current ($I_1$).

In addition to providing near constant $g_m$ across the entire common mode voltage range and limiting phase margin degradation in the $V_{cross}$ boundary region, one skilled in the art would understand how the CMOS input stage 500 shown in FIGS. 5 and 6 could be used to provide additional advantages. For example, if CMOS input stage 500 is used to maintain a near constant $g_{m1}$ across the entire common-mode input voltage range and minimize phase margin degradation in the first stage of a two-stage operational amplifier (such as amplifier 300 of FIG. 3 (Prior Art)), the transconductance ($g_{m2}$) of the second stage can be reduced. Since most of the amplifier power is consumed in the second stage, the total power consumed by the operational amplifier can be significantly reduced by using CMOS input stage 500 to minimize phase margin degradation in the first stage and configuring the second stage with a minimum required amount of transconductance ($g_{m2}$). This enables a less complex architecture to be used in the second stage of the operational amplifier.

Figure 8:
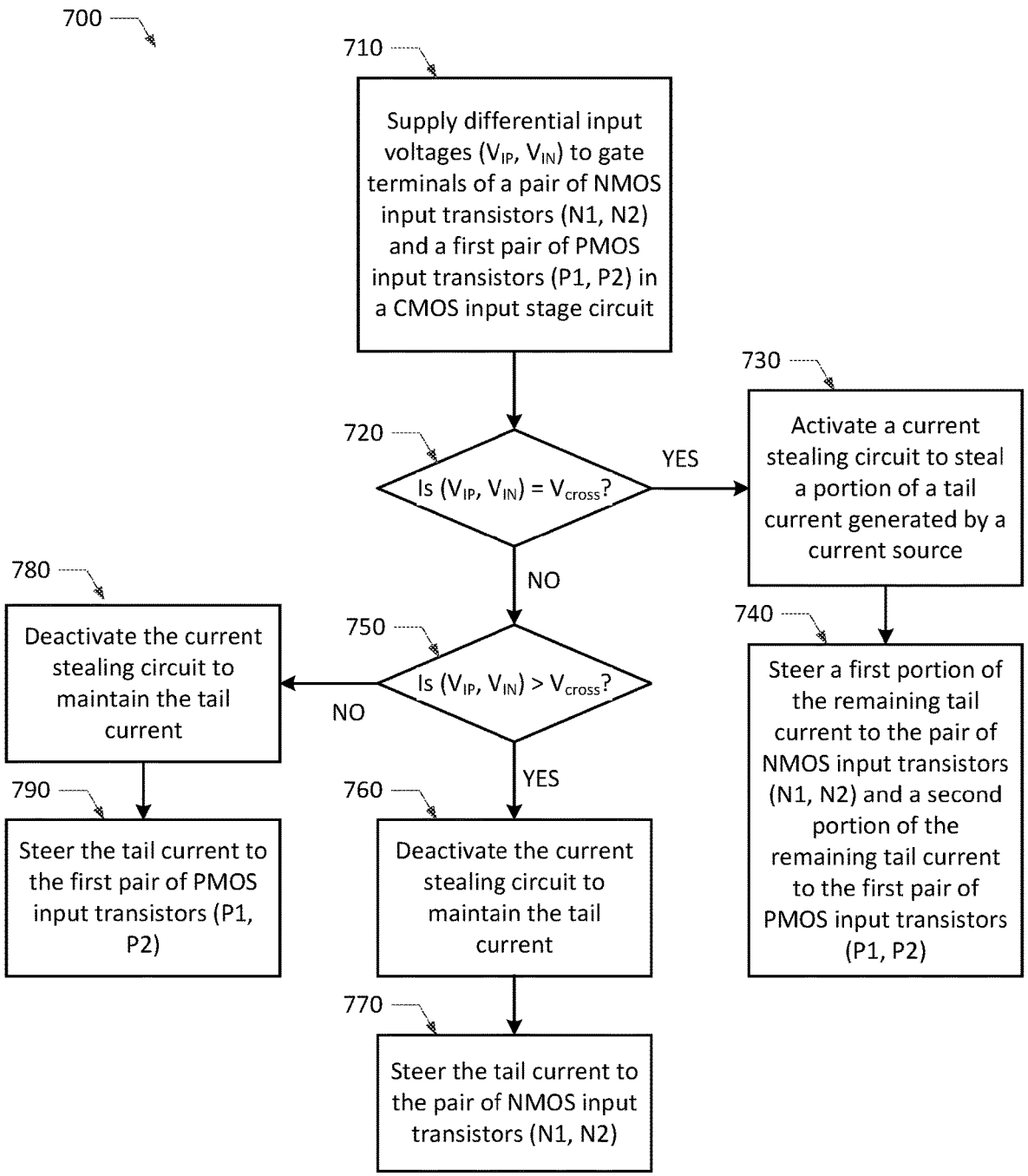
FIG. 8 is a flowchart diagram illustrating one embodiment of a method to maintain near constant transconductance ($g_m$) across a common-mode input voltage range of a complementary metal-oxide-semiconductor (CMOS) input stage circuit.

FIG. 8 is a flowchart diagram illustrating one embodiment of a method 700 that may be used to maintain near constant transconductance ($g_m$) across a common-mode input voltage range of a CMOS input stage circuit. The CMOS input stage circuit may be generally configured as shown in FIGS. 5 and 6 and described above. In some embodiments, the method may begin (in step 710) by supplying differential input voltages (average of $V_{IP}$ and $V_{IN}$) to gate terminals of the pair of NMOS input transistors (N1, N2), the first pair of PMOS input transistors (P1, P2) and the second pair of PMOS input transistors (P9, P10) of the CMOS input stage circuit. In steps 720 and 750, the method determines whether the common-mode input voltage (the average of $V_{IP}$ and $V_{IN}$) is significantly greater than, significantly less than or substantially equal to the cross-over voltage ($V_{cross}$).

When the common-mode input voltage is substantially equal to the cross-over voltage (YES branch of step 720), the current stealing circuit 570 is activated to steal a portion of the tail current (i.e., first current, $I_1$) generated by the tail current source 550 (in step 730), and a first portion of the remaining tail current is steered to the pair of NMOS input transistors (N1, N2) and a second portion of the remaining tail current is steered to the first pair of PMOS input transistors (P1, P2) (in step 740). In some embodiments, step 730 may be achieved by partially turning on the third PMOS transistor (P11) and the second PMOS transistor (P8), as shown in FIG. 6 and described above. This allows the second current to flow through the second pair of PMOS input transistors (P9, P10) to the NMOS transistor N10 in the second NMOS current mirror (N9, N10), where it is mirrored to NMOS transistor N9 to generate the stolen current ($I_{steal}$). Turning on the second PMOS transistor (P8) generates the current ($I_{steal}$), which is stolen from the tail current ($I_1$). Although step 740 is illustrated in FIG. 8 as occurring after step 730, one skilled in the art would understand that step 740 may be performed concurrently with step 730.

When the common-mode input voltage is significantly greater than the cross-over voltage (NO branch of step 720 and YES branch of step 750), the current stealing circuit 570 is deactivated to maintain the tail current (i.e., first current, $I_1$) (in step 760), and the tail current is steered to the pair of NMOS input transistors (N1, N2) (in step 770). In some embodiments, the tail current may be maintained (in step 760) by turning on the third PMOS transistor (P11) to prevent the second current from flowing through the second pair of PMOS input transistors (P9, P10) to the NMOS transistor N10 in the second NMOS current mirror. This prevents NMOS transistor N9 from generating the stolen current, thereby maintaining the tail current supplied to the pair of NMOS input transistors (N1, N2). Although step 770 is illustrated in FIG. 8 as occurring after step 760, one skilled in the art would understand that step 770 may be performed concurrently with step 760.

When the common-mode input voltage is significantly less than the cross-over voltage steering (NO branch of step 720 and NO branch of step 750), the current stealing circuit 570 is deactivated to maintain the tail current (i.e., first current, $I_1$) (in step 780), and the tail current is steered to the first pair of PMOS input transistors (P1, P2) (in step 790). In some embodiments, the tail current may be maintained (in step 780) by turning off the third PMOS transistor (P11) and the second PMOS transistor (P8). Turning off the third PMOS transistor (P11) allows the second current to flow through the second pair of PMOS input transistors (P9, P10) to the NMOS transistor N10 in the second NMOS current mirror (N9, N10), which enables NMOS transistor N9 to generate the stolen current. However, turning off the second PMOS transistor (P8) cuts off the stolen current to maintain the tail current supplied to the first pair of PMOS input transistors (P1, P2). Although step 790 is illustrated in FIG. 8 as occurring after step 780, one skilled in the art would understand that step 790 may be performed concurrently with step 780.

It will be appreciated to those skilled in the art having the benefit of this disclosure that this disclosure is believed to provide various embodiments of improved CMOS input stage circuits and related methods to maintain a near constant transconductance ($g_m$) across the entire common mode voltage (CMV) range, including within a near voltage region surrounding a cross-over voltage ($V_{cross}$) boundary between a low CMV region and a high CMV region of the CMV range. Further modifications and alternative embodiments of various aspects of the disclosure will be apparent to those skilled in the art in view of this description. For example, although the input stage circuits disclosed herein are implemented using CMOS technology, the disclosed input stage circuits could be alternatively implemented using other types of field effect transistors (FETs) or bipolar junction transistors (BJTs).

It is to be understood that the various embodiments of the disclosed CMOS input stage circuits shown and described herein are to be taken as the presently preferred embodiments. Elements and materials may be substituted for those illustrated and described herein, parts and processes may be reversed, and certain features of the disclosed embodiments may be utilized independently, all as would be apparent to one skilled in the art after having the benefit of this disclosure. It is intended, therefore, that the following claims be interpreted to embrace all such modifications and changes and, accordingly, the specification and drawings are to be regarded in an illustrative rather than a restrictive sense.

What is claimed is:

1. A complementary metal-oxide-semiconductor (CMOS) input stage circuit, comprising:
   a pair of NMOS input transistors and a first pair of PMOS input transistors, each coupled to receive differential input voltages at gate terminals thereof;
   a first current source coupled to source terminals of the first pair of PMOS input transistors and configured to generate a first current;
   a current steering circuit coupled to receive a cross-over voltage and configured to steer the first current to the pair of NMOS input transistors or to the first pair of PMOS input transistors or to both, depending on whether a common-mode input voltage is significantly greater than, significantly less than or substantially equal to the cross-over voltage; and
   a current stealing circuit coupled to receive the cross-over voltage and configured to steal a portion of the first current, so that a smaller remaining portion of the first current is divided among the pair of NMOS input transistors and the first pair of PMOS input transistors when the common-mode input voltage is substantially equal to the cross-over voltage.

2. The CMOS input stage circuit recited in claim 1, wherein:
   the pair of NMOS input transistors have source terminals that are coupled together and drain terminals coupled to a first current summation circuit of the CMOS input stage circuit; and
   the first pair of PMOS input transistors have source terminals that are connected together and drain terminals coupled to a second current summation circuit of the CMOS input stage circuit.

3. The CMOS input stage circuit recited in claim 1, wherein the current steering circuit comprises:
   a first PMOS transistor having a source terminal coupled to the source terminals of the first pair of PMOS input transistors and a gate terminal coupled to receive the cross-over voltage; and
   a first NMOS current mirror coupled between a drain terminal of the first PMOS transistor and source terminals of the pair of NMOS input transistors.

4. The CMOS input stage circuit recited in claim 3, wherein:
   when the common-mode input voltage is significantly greater than the cross-over voltage, the first PMOS transistor turns on and the first current flows through the first PMOS transistor and is mirrored by the first NMOS current mirror to the source terminals of the pair of NMOS input transistors;
   when the common-mode input voltage is significantly less than the cross-over voltage, the first PMOS transistor turns off and the first current is supplied to the source terminals of the first pair of PMOS input transistors; and
   when the common-mode input voltage is substantially equal to the cross-over voltage, the first PMOS transistor partially turns on, such that a first portion of the remaining portion of the first current is supplied to the pair of NMOS input transistors and a second portion of the remaining portion of the first current is supplied to the first pair of PMOS input transistors.

5. The CMOS input stage circuit recited in claim 1, wherein the current stealing circuit comprises:
   a second PMOS transistor having a source terminal coupled to the source terminals of the first pair of PMOS input transistors and a gate terminal coupled to receive the cross-over voltage; and
   a second NMOS current mirror coupled between drain terminals of the second pair of PMOS input transistors and a drain terminal of the second PMOS transistor.

6. The CMOS input stage circuit recited in claim 5, wherein the second NMOS current mirror acts like a current source for generating a stolen current, which is stolen from the first current, when the common-mode input voltage is substantially equal to the cross-over voltage, and wherein the second PMOS transistor acts like a switch to turn the stolen current on/off.

7. The CMOS input stage circuit recited in claim 6, wherein the stolen current generated by the second NMOS current mirror is substantially equal to about one-quarter to about one-half of the first current.

8. The CMOS input stage circuit recited in claim 6, wherein:

when the common-mode input voltage is greater than or equal to the cross-over voltage, the second PMOS transistor turns on to conduct the stolen current; and when the common-mode input voltage is less than the cross-over voltage, the second PMOS transistor turns off to cut off the stolen current.

9. The CMOS input stage circuit recited in claim 5, wherein the current stealing circuit further comprises:
a second pair of PMOS input transistors having source terminals that are connected together and gate terminals couples to receive the differential input voltages;
a second current source coupled to the source terminals of the second pair of PMOS input transistors and configured to generate a second current;
a third PMOS transistor having a source terminal coupled to the source terminals of the second pair of PMOS transistors and a gate terminal coupled to receive the cross-over voltage; and
a third NMOS transistor having gate and drain terminals coupled to the drain terminal of the third PMOS transistor and a source terminal coupled to ground.

10. The CMOS input stage circuit recited in claim 9, wherein the third PMOS transistor is configured to prevent or allow the second current to flow through the second pair of PMOS input transistors to the second NMOS current mirror, depending on whether the common-mode input voltage is greater than or less than the cross-over voltage.

11. The CMOS input stage circuit recited in claim 9, wherein when the common-mode input voltage is significantly greater than the cross-over voltage, the third PMOS transistor turns on to prevent the second current from flowing through the second pair of PMOS input transistors to the second NMOS current mirror, which prevents the second NMOS current mirror from generating the stolen current.

12. The CMOS input stage circuit recited in claim 9, wherein when the common-mode input voltage is significantly less than the cross-over voltage:
the third PMOS transistor turns off to allow the second current to flow through the second pair of PMOS input transistors to the second NMOS current mirror, which enables the second NMOS current mirror to generate the stolen current; and
the second PMOS transistor turns off to cut off the stolen current.

13. The CMOS input stage circuit recited in claim 9, wherein when the common-mode input voltage is substantially equal to the cross-over voltage:
the third PMOS transistor partially turns on to allow the second current to flow through the second pair of PMOS input transistors to the second NMOS current mirror, which enables the second NMOS current mirror to generate the stolen current; and
the second PMOS transistor partially turns on to conduct the stolen current that is stolen from the first current.

14. A method for a complementary metal-oxide-semiconductor (CMOS) input stage circuit comprising a pair of NMOS input transistors and a first pair of PMOS input transistors, the method comprising:
supplying differential input voltages to gate terminals of the pair of NMOS input transistors and the first pair of PMOS input transistors;
steering a first current to the pair of NMOS input transistors or to the first pair of PMOS input transistors or to both, depending on whether a common-mode input voltage is significantly greater than, significantly less than or substantially equal to a cross-over voltage; and stealing a portion of the first current, so that a smaller remaining portion of the first current is divided among the pair of NMOS input transistors and the first pair of PMOS input transistors when the common-mode input voltage is substantially equal to the cross-over voltage to maintain near constant transconductance ($g_m$) across the common-mode input voltage range of the CMOS input stage circuit.

15. The method as recited in claim 14, further comprising maintaining the first current supplied to the pair of NMOS input transistors or the first pair of PMOS input transistors when the common-mode input voltage is significantly greater than or significantly less than the cross-over voltage, respectively.

16. The method as recited in claim 14, wherein said steering a first current comprises:
steering the first current to the pair of NMOS input transistors when the common-mode input voltage is significantly greater than the cross-over voltage;
steering the first current to the first pair of PMOS input transistors when the common-mode input voltage is significantly less than the cross-over voltage; and
steering a first portion of the smaller remaining portion of the first current to the pair of NMOS input transistors and a second portion of the smaller remaining portion of the first current to the first pair of PMOS input transistors when the common-mode input voltage is substantially equal to the cross-over voltage.

17. The method as recited in claim 14, wherein the CMOS input stage circuit further comprises:
a second pair of PMOS input transistors having source terminals that are connected together and gate terminals coupled to receive the differential input voltage;
a second current source coupled to the source terminals of the second pair of PMOS input transistors and configured to generate a second current;
a second PMOS transistor having a source terminal coupled to the source terminals of the first pair of PMOS input transistors and a gate terminal coupled to receive the cross-over voltage;
a second NMOS current mirror coupled between drain terminals of the second pair of PMOS input transistors and a drain terminal of the second PMOS transistor; and
a third PMOS transistor having a source terminal coupled to the source terminals of the second pair of PMOS transistors and a gate terminal coupled to receive the cross-over voltage.

18. The method as recited in claim 17, wherein the second NMOS current mirror acts like a current source for generating a stolen current, which is stolen from the first current, when the common-mode input voltage is substantially equal to the cross-over voltage, and wherein the second PMOS transistor acts like a switch to turn the stolen current on/off.

19. The method as recited in claim 18, wherein said stealing a portion of the first current comprises stealing a portion of the first current only when the common-mode input voltage is substantially equal to the cross-over voltage by:
partially turning on the third PMOS transistor to allow the second current to flow through the second pair of PMOS input transistors to the second NMOS current mirror, which enables the second NMOS current mirror to generate the stolen current; and
partially turning on the second PMOS transistor to conduct the stolen current, which is stolen from the first current.

20. The method as recited in claim 18, further comprising maintaining the first current supplied to the pair of NMOS input transistors when the common-mode input voltage is significantly greater than the cross-over voltage by:
- turning on the third PMOS transistor to prevent the second current from flowing through the second pair of PMOS input transistors to the second NMOS current mirror, which prevents the second NMOS current mirror from generating the stolen current.

21. The method as recited in claim 18, further comprising maintaining the first current supplied to the first pair of PMOS input transistors when the common-mode input voltage is significantly less than the cross-over voltage by:
- turning off the third PMOS transistor to allow the second current to flow through the second pair of PMOS input transistors to the second NMOS current mirror, which enables the second NMOS current mirror to generate the stolen current; and
- turning off the second PMOS transistor to cut off the stolen current and maintain the first current supplied to the first pair of PMOS input transistors.

* * * * *